(12) United States Patent
Roziere

(10) Patent No.: US 9,250,757 B2
(45) Date of Patent: Feb. 2, 2016

(54) SWITCHED-ELECTRODE CAPACITIVE-MEASUREMENT DEVICE FOR TOUCH-SENSITIVE AND CONTACTLESS INTERFACES

(71) Applicant: NANOTEC SOLUTION, Nimes (FR)

(72) Inventor: Didier Roziere, Nimes (FR)

(73) Assignee: Nanotec Solution, Nimes (FR)

( * ) Notice: Subject to any disclaimer, the term of this patent is extended or adjusted under 35 U.S.C. 154(b) by 42 days.

(21) Appl. No.: 14/354,334

(22) PCT Filed: Dec. 18, 2012

(86) PCT No.: PCT/FR2012/052974
§ 371 (c)(1),
(2) Date: Apr. 25, 2014

(87) PCT Pub. No.: WO2013/093327
PCT Pub. Date: Jun. 27, 2013

(65) Prior Publication Data
US 2014/0267165 A1    Sep. 18, 2014

(30) Foreign Application Priority Data

Dec. 22, 2011    (FR) ..................... 11 62246

(51) Int. Cl.
*G06F 3/044* (2006.01)
*G01R 27/26* (2006.01)

(52) U.S. Cl.
CPC ............ *G06F 3/044* (2013.01); *G01R 27/2605* (2013.01); *G06F 2203/04107* (2013.01)

(58) Field of Classification Search
CPC ............ G06F 2203/04108; G06F 2203/04107; G06F 3/044; G01R 27/2605

USPC ..................... 345/173, 174; 178/18.06, 18.05; 324/686

See application file for complete search history.

(56) References Cited

U.S. PATENT DOCUMENTS

| 2002/0015024 | A1* | 2/2002 | Westerman | ........... G06F 3/0235 345/173 |
| 2005/0219228 | A1* | 10/2005 | Alameh | ................ G06F 1/1626 345/173 |

(Continued)

FOREIGN PATENT DOCUMENTS

| FR | 2756048 | 5/1998 |
| FR | 2 949 008 | 2/2011 |

(Continued)

OTHER PUBLICATIONS

International Search Report dated Apr. 16, 2013, corresponding to PCT/FR2012/052974.

*Primary Examiner* — Lun-Yi Lao
*Assistant Examiner* — Ibrahim Khan
(74) *Attorney, Agent, or Firm* — Morrison & Foerster LLP

(57) ABSTRACT

The present invention relates to a capacitive-measurement device for touch-sensitive and/or contactless interfaces, including at least one capacitive-measurement electrode and electrode-switching unit capable of electrically connecting the at least one electrode, either to a capacitive-measurement unit or to a guard potential, the at least one capacitive-measurement electrode and the electrode-switching unit being provided on a single detection surface according to a technique for manufacturing planar electronic components. The invention also relates to an apparatus implementing the device.

20 Claims, 2 Drawing Sheets

(56) References Cited

U.S. PATENT DOCUMENTS

| | | | | |
|---|---|---|---|---|
| 2008/0062148 | A1* | 3/2008 | Hotelling | G02F 1/13338 345/174 |
| 2009/0091546 | A1* | 4/2009 | Joo | G02F 1/13338 345/173 |
| 2009/0212642 | A1* | 8/2009 | Krah | G06F 1/3203 307/109 |
| 2010/0149127 | A1* | 6/2010 | Fisher | G06F 3/0362 345/174 |
| 2012/0187965 | A1 | 7/2012 | Roziere | |
| 2012/0188201 | A1* | 7/2012 | Binstead | G06F 3/041 345/174 |
| 2014/0070823 | A1 | 3/2014 | Roziere | |

FOREIGN PATENT DOCUMENTS

| WO | 2008/000964 | 1/2008 |
|---|---|---|
| WO | 2011015795 | 2/2011 |

\* cited by examiner

SWITCHED-ELECTRODE CAPACITIVE-MEASUREMENT DEVICE FOR TOUCH-SENSITIVE AND CONTACTLESS INTERFACES

BACKGROUND OF THE INVENTION

1. Field of the Invention

The present invention relates to a capacitive measurement device for producing touch-sensitive and contactless human-machine interfaces, which allows an optimal integration of a large number of measurement electrodes on a detection surface. The field of the invention is more particularly but is non-limitatively that of touch-sensitive and contactless human-machine interfaces.

2. Description of the Related Art

Many devices used for communication and for work use a touch-sensitive or contactless command interface such as a pad or a screen. This type of interface can be found for example in mobile telephones, smartphones, computers with touch-sensitive screens, pads, PCs, mouse devices, touch pads and widescreens etc.

These interfaces frequently use capacitive technologies. The touch surface is equipped with conductive electrodes connected to electronic means which make it possible to measure the variation of the capacitances appearing between the electrodes and the object to be detected in order to carry out a command.

It is possible to provide transparent electrodes which make it possible to superimpose an interface onto a display screen, for example of a smartphone.

Most of these interfaces are touch-sensitive, that is they can detect contact between one or more command object(s) (usually the fingers) and the surface of the interface. Gestural or contactless interfaces are increasingly being developed which are capable of detecting command objects which are further from the interface, without contact with the surface.

The capacitive techniques currently implemented in touch-sensitive interfaces most frequently use two layers of conductive electrodes in the form of rows and columns. The electronics measure the coupling capacitances existing between these rows and columns. When a finger is very close to the active surface, the coupling capacitances close to the finger are altered and the electronics can thus locate the 2D position (XY) in the plane of the active surface.

These technologies, often called "mutual capacitance", make it possible to detect the presence and the position of the finger through a thin dielectric. They have the advantage of enabling a very good resolution in the location in the plane (XY) of the touch surface of one or more fingers. With appropriate processing software, it is also possible to manage a large number of fingers if the surface of the interface is large enough.

However, these techniques have the drawback of generating on principle large leakage capacitances at the level of the measurement electrodes and of the electronics. In fact the detection of a finger is achieved by measuring the variation in the coupling capacitance created between each row and column of which one is the emitter of an electrical signal and the other is a receiver of the signal to be detected. This signal is proportional to the capacitance between the row and column selected. When a finger is very close to the intersection of the row and column in question, the coupling capacitance is reduced and the finger is detected.

These coupling capacitances, which can be significant even in the absence of the object to be detected, can also drift over time due to ageing, deformation of the materials, or the effect of the variation of the surrounding temperature. These variations can degrade the sensitivity of the electrodes, or can even trigger commands in an untimely manner. This is one of the reasons why these technologies can only detect contact with the finger and not its approach because it is necessary to create a large variation in the capacitance to enable the electric circuit to detect the variation which must be much larger than the drifts to avoid any [capacitance] artefact.

Techniques are also known which make it possible to measure the absolute capacitance which appears between the electrodes and an object to be detected. These techniques are often called "self capacitance". Document FR 2 756 048 by Rozière is known for example, which discloses a method of capacitive measurement which makes it possible to measure the capacitance and the distance between a plurality of independent electrodes and a nearby object.

This technology uses a guard in order to eliminate all stray capacitance. All the electrodes have the same potential and there is therefore no coupling capacitance between the electrodes that is capable of degrading the capacitance measurement.

This technology is well suited to touch-sensitive and contactless interfaces such as capacitive pads and transparent touchpads and/or small 3D screens, such as the pads of portable computers or the small screens of smartphones. On the other hand, when the pad or the screen is of greater size, the number of electrodes necessary to cover the entire touch surface is too large to be managed by a miniature electronic circuit. And above all, the surface at the periphery of the touch surface and between the electrodes which is necessary for the passage of the tracks connecting the electrodes to the electronics also becomes very significant.

With this technique it is possible to use electrodes in the form of rows and columns in order to minimize interconnection problems. This row-column structure, in which rows and columns are used as independent electrodes, makes contactless or gestural measurement over long distances possible (detection of a finger several centimeters away) but another problem appears when more than one object is to be detected. In fact, it is necessary to scan each row and each column which produces a measurement for virtual objects called ghosts. These ghosts prevent a number of objects from being located absolutely on the touch surface.

The purpose of the present invention is to propose a capacitive measurement device for touch-sensitive and/or contactless interfaces which makes it possible to implement a high number of capacitive measurement electrodes on a detection surface while limiting interconnection problems of these electrodes with the measurement electronics.

BRIEF SUMMARY OF THE INVENTION

This objective is achieved with a capacitive measurement device for touch-sensitive and/or contactless interfaces comprising at least one capacitive measurement electrode and means of electrode switching capable of electrically connecting said at least one electrode, either to capacitive measurement means or to a guard potential, characterized in that said at least one capacitive measurement electrode and said means of electrode switching are produced on a single detection surface according to a manufacturing technique for electronic components of planar type.

Manufacturing techniques for electronic components of planar type can comprise in particular techniques originating from microelectronics. They can comprise, but are not limited to, layer deposition operations, in particular of thin layers, evaporation, masking, chemical etching, dry etching, ion implantation, deposition of products in solution, inkjet printing etc.

The device according to the invention can comprise moreover:
- a plurality of capacitive measurement electrodes distributed over a detection surface according to a two-dimensional structure with two intersecting directions,
- means of electrode switching placed nearby said measurement electrodes on the detection surface,
- first electrical connection tracks arranged on the detection surface in such a way as to be capable of connecting to the capacitive measurement means via their respective means of electrode switching, a plurality of measurement electrodes distributed approximately in a first direction, and
- second electrical connection tracks arranged on the detection surface in such a way as to be capable of connecting, on a switching signal, the respective means of electrode switching of a plurality of measurement electrodes distributed approximately in the second direction.

The capacitive measurement electrodes can in particular be distributed on the detection surface following a matrix structure approximately in rows and columns According to embodiments, the device according to the invention can comprise moreover:
- a guard plane in an appreciably electrically conductive material, at the electrical guard potential, arranged below the measurement electrodes and separated from said electrodes by at least one layer of an appreciably electrically insulating material;
- means of electrode switching connected electrically to the guard plane by electrical connections passing through the layer(s) of appreciably insulating material.

The means of electrode switching can comprise two transistors, of which a first transistor is capable of connecting a measurement electrode to the capacitive measurement means and a second transistor is capable of connecting said measurement electrode to the guard potential, which transistors are controlled by a switching signal such that when one is on-state the other is off-state.

According to embodiments, the device according to the invention can comprise moreover:
- transistors produced according to a thin layer deposition technology;
- transistors which are substantially transparent;
- transistors of one of the following types: TFT (Thin-Film Transistor) type field-effect transistor, OFET (organic field-effect transistor) type transistors based on organic semiconductors.

According to embodiments, the device according to the invention can be produced in such a way as to be substantially transparent.

It can comprise at least one element among measurement electrodes, a guard plane and tracks comprising ITO (tin-doped indium oxide).

According to embodiments, the device according to the invention can comprise moreover second switching means capable of connecting the means of electrode switching either to capacitive measurement means or to a guard potential.

According to embodiments, the device according to the invention can comprise moreover capacitive measurement means at least in part referenced to a reference electrical potential which is floating with respect to earth potential.

The reference electrical potential can be approximately equal to the guard potential. According to another aspect, a human-machine interface device is proposed comprising a command interface and a capacitive measurement device according to the invention.

The human-machine interface device can comprise a command interface equipped with a display screen, and a capacitive measurement device which is substantially transparent.

According to yet another aspect, a device is proposed of one of the following types: smartphone, tablet, display screen, computer, control pad for a machine or vehicle, comprising a human-machine interface device according to the invention.

Thus, according to the particularly advantageous aspects, the invention makes it possible to provide measurement devices:
- which make it possible to implement independent capacitive measurement electrodes which can measure multiple objects without problems of ghost measurements,
- whilst minimizing the surface utilized by the electrical connection tracks since one track between the rows or the columns of measurement electrodes is sufficient.

The solution of the invention thus makes it possible to optimize the number and/or the surface of the measurement electrodes. It is also possible to make the tracks wider and more remote from the electrodes, which makes it possible to reduce their resistivity (which may not be negligible when using materials such as ITO) and to limit the parasitic effects resulting from flows between tracks and adjacent electrodes.

BRIEF DESCRIPTION OF THE DRAWINGS

Other advantages and features of the invention will become apparent on reading the detailed description of implementations and embodiments which are in no way limitative, and from the following attached drawings.

DETAILED DESCRIPTION OF THE PREFERRED EMBODIMENTS

Figure 1:
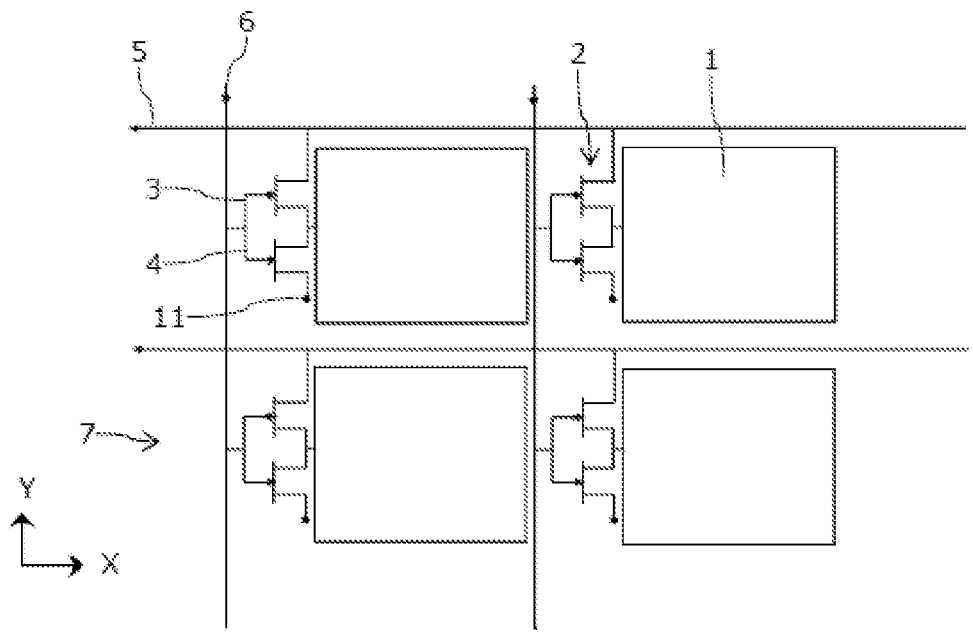
FIG. 1 shows a top view of a capacitive measurement device according to the invention.
Figure 2:
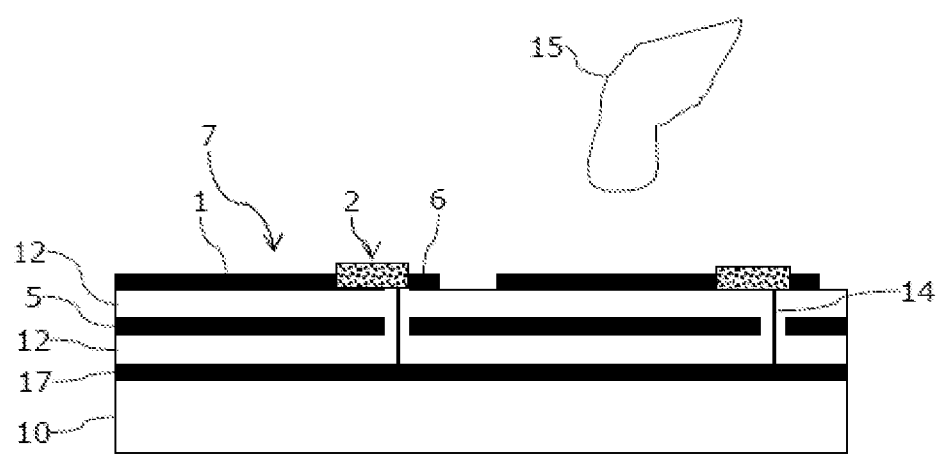
FIG. 2 shows a cross-sectional view of the capacitive measurement device of FIG. 1.
Figure 3:
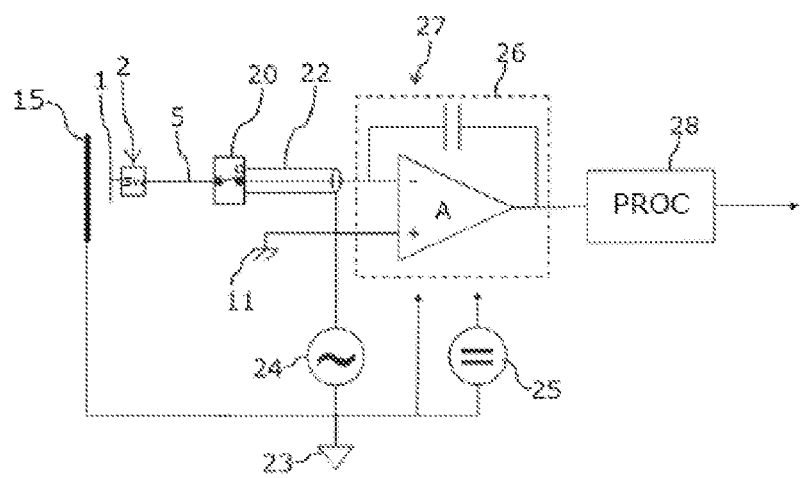
FIG. 3 shows an embodiment of capacitive measurement electronics implemented in the capacitive measurement device of FIGS. 1 and 2.

FIGS. 1, 2 and 3 are illustrative diagrams from which no scale or proportions can be deduced.

An example of an embodiment of a device according to the invention will be described which makes it possible to manufacture touch-sensitive and contactless interfaces for systems or devices such as mobile telephones (smartphones), tablets, computers or control pads.

With reference to FIGS. 1 and 2, the measurement device according to the invention comprises a plurality of capacitive measurement electrodes 1 distributed on a detection surface 7 according to a matrix structure in rows and columns, corresponding to two intersecting directions X, Y.

The detection surface 7 constitutes the surface of a command interface 10 which comprises a display screen, for example of the TFT (Thin-Film Transistor) type or OLED (organic light-emitting diodes) type.

The command interface 10 and the superimposed capacitive measurement device constitute a human-machine interface for the system.

The electrodes 1 make it possible to detect the approach and/or contact of one or more object(s) of interest 15 such as a finger 15 by measuring the capacitive coupling which is established between them and the finger 15.

The distance between the finger 15 and the electrodes 1 can be deduced from measuring the capacitive coupling, while the location of the finger 15 in the plane (X,Y) of the detection surface 7 can be obtained from the location of the electrodes 1 which detect the presence of the finger 15.

With reference to FIG. 3, the capacitive coupling is measured by the electronic capacitive measurement means 27.

The electrodes 1 are connected to the means of electrode switching 2 which make it possible to connect them:
  either to the electronic capacitive measurement means 27 via the first electrical connection tracks 5, or measurement tracks 5,
  or to a guard potential 11.

The means of electrode switching 2 are controlled by a switching signal to which they are connected by the second electrical connection tracks 6, or switching tracks 6.

The measurement tracks 5 connect the electrodes 1 distributed according to a direction X of the matrix, and the switching tracks 6 connect the electrodes 1 distributed according to a second direction Y of the matrix.

The device also includes a guard plane 17 at an electrical guard potential 11, which is placed below the electrodes 1 opposite their detection surface. This guard plane 17 forms an electrical shielding which protects the electrodes from the influence of the command interface 10.

The assembly is formed according to a multilayer 5 structure with:
  a first layer including the electrodes 1, the measurement tracks 5 and the means of electrode switching 2,
  a second layer including the switching tracks 6, and
  a third layer including the guard plane 17.

The layers are separated by layers of insulating material 12.

The switching means are connected to the guard potential 11 by passing through connections 14 connected to the guard plane 17.

The electrodes 1, the guard plane 17 and the tracks 5, 6 are made from a material which is substantially transparent such as ITO (tin-doped indium oxide) deposited for example by evaporation under vacuum onto the underlying insulating dielectric layer.

The surface of the command interface 10 can be made of glass or a polymer such as PET.

The layers of insulating material 12 are made of a polymer material.

The switching means 1 comprise two transistors of the field-effect type 3, 4, one of which is set to channel N and the other is set to channel P:
  the gate of the two transistors 3, 4 is connected to a switching track 6 which conveys the switching signal,
  a first transistor 3 is connected by its two other terminals (drain and source) respectively to a measurement track 5 and to electrode 1,
  a second transistor 4 is connected by its two other terminals (drain and source) respectively to the guard potential 11 and to electrode 1.

Depending on the polarity and/or the level of the switching signal, one of the transistors 3, 4 is on-state with a very low electrical resistance while the other is off-state with a very high electrical resistance, and vice versa. Thus, the electrode 1 is always connected either to a measurement track 5 or to the guard potential 11.

The transistors 3, 4 are produced using a technique which makes it possible to produce transistors which are substantially transparent to the human eye.

Thus, the whole capacitive measurement device is sufficiently transparent to be able to be superimposed on a display screen.

Two known families of techniques are suitable for producing the transistors 3, 4 in the embodiment presented: TFT type transistors (Thin-Film Transistors) or OFET type transistors (field-effect transistors made from organic semiconductors). In both cases the electrodes can be made from ITO.

The TFT type transistors are based on thin layers of silicon depositions. This is a very common technique for producing display screens but it has the drawback, at least for certain embodiments, of requiring operations at high temperature.

OFET type transistors are made from organic semiconductors using structures which are often similar to those of TFT transistors. They can, for example, utilize an organic polymer such as polymethyl methacrylate (PMMA) as gate dielectric.

OFET type transistors can be produced using well known techniques of evaporation under vacuum, by deposition from polymer solutions, by mechanical transfer or even by inkjet printing techniques. Therefore they have the advantage of being able to be produced using low cost techniques at ambient temperature.

The measurement electrodes 1 are connected to the electronic capacitive measurement means 27 via the measurement tracks 5.

These electronic capacitive measurement means 27, in the embodiment in FIG. 3, are produced in the form of a floating capacitative measuring bridge system as described for example in document FR 2 756 048 by Rozière.

The detection circuit comprises a part known as a floating part 26 the reference potential 11 of which, called guard potential 11, oscillates with respect to the earth 23 of the overall system. The alternating potential difference between the guard potential 11 and the earth 23 is generated by an excitation source, or an oscillator 24. The floating part 26 comprises the sensitive part of the capacitive detection, represented in FIG. 3 by a charge amplifier. It can also be understood to comprise other means of processing and conditioning the signal, including digital means or microprocessor based means, also referenced to the guard potential 11. These means of processing and conditioning make it possible, for example, to calculate data relating to distance and pressure from capacitive measurements.

The power supply of the floating part 26 is ensured by floating power transfer means 25, comprising for example DC/DC converters.

This capacitive measurement system makes it possible to measure capacitance data between a measurement electrode 1 and an object such as a finger 15.

The object to be detected 15 must be connected to a potential which is different from the guard potential 11, such as for example the earth potential 23. A finger 15 of a user, whose body defines an electrical earth, is useful in this configuration.

An array of switches or analogue switches 20, controlled by the electronic control means, makes it possible to select a measurement track 5. It can potentially select all the electrodes 1 in one row in the embodiment in FIG. 1.

The switches 20 are configured in such a way that a measurement track 5 is connected either to the capacitive detection electronics 27, or to the guard potential 11.

The selection of a particular electrode 1 connected to this measurement track 5 can be carried out by sending a switching signal on the corresponding switching track 6 so as to configure the means of electrode switching 2 of the electrode 1 to connect it to the measurement track 5.

Thus it is possible to connect only a single electrode 1 to the capacitive detection electronics 27 in order to measure the coupling capacitance between it and the object 15.

Thus all the electrodes can be "interrogated" sequentially and individually. It is also possible to interrogate groups of electrodes 1 globally by activating several switching signals and/or by implementing several detection electronics 27.

The electrodes 1 which are not connected to the capacitive detection electronics 27 are all connected to the guard potential 11, either by the means of electrode switching 2, or by the switches 20.

The sensitive part of the detection is protected by a guard shielding 22 connected to the guard potential 11.

Thus, an active electrode 1 connected to the capacitive detection electronics 27 is surrounded by elements connected to the guard potential 11, including the inactive electrodes 1 and on its rear face the guard plane 17.

As the active measurement electrode 1 is also at the guard potential 11, it is therefore possible to avoid stray capacitances between this electrode 1 and its surroundings in such a way that only the coupling with the object of interest 15 is measured with a maximum sensitivity.

The floating electronics 26 are connected at the output to the system electronics 28 referenced to earth 23 by electrical connections which are compatible with the difference in reference potentials. These connections can comprise for example differential amplifiers or optocouplers.

Data about the position of the object or the objects 15 in space relative to the detection surface 7 are obtained in this way.

These data are processed by the detection electronics 27 and transmitted to the system electronics 28 to be utilized in particular in the human-machine interface.

According to variants:
- the capacitive measurement device can be produced by different layered structures, of which in particular (i) the switching tracks 6 are on the same layer as the electrodes 1 and the measurement tracks 5 are on a second layer, or (ii) the switching 6 and measurement 5 tracks are on the same layer with, or without, the electrodes 1, and with electrical connection bridges at the crossing points;
- the device can comprise guard tracks which make it possible to connect the means of electrode switching 2 to the guard potential 11 at the edge of the detection surface, optionally without through connections 14;
- the means of electrode switching 2, of which in particular the transistors 3, 4, can be produced on a different layer from the electrodes 1. They can be placed below the electrodes 1 in order to optimize the surface available for detection;
- the means of electrode switching 2 can be grouped together in particular areas of the detection surface 7 (edges, areas in which it is possible to utilize transistors which are not transparent);
- the capacitive measurement device can be produced with metal electrodes and/or a metal guard plane and/or non-transparent opaque transistors (FET, MOSFET, etc.), in particular for applications where an underlying display is not envisaged.

Of course, the invention is not limited to the examples which have just been described and numerous adjustments can be made to these examples without exceeding the scope of the invention.

The invention claimed is:

1. A capacitive measurement device for touch-sensitive and/or contactless interfaces, comprising:
    at least one capacitive measurement electrode; and
    at least one electrode switch configured to selectively electrically connect said at least one capacitive measurement electrode to means for measuring a capacitive coupling between the at least one capacitive measurement electrode and at least one object of interest, and to a guard potential so that said at least one capacitive measurement electrode is always connected either to said means for measuring the capacitive coupling or to said guard potential,
    wherein the at least one capacitive measurement electrode and said electrode switch are formed on a single detection surface of a planar electronic component.

2. The capacitive measurement device according to claim 1, wherein the at least one capacitive measurement electrode includes a plurality of capacitive measurement electrodes distributed over the detection surface according to a matrix structure in rows and columns corresponding to two intersecting directions, and
    the at least one electrode switch includes a plurality of electrode switches, each of said electrode switches being placed on the detection surface nearby one of the at least one capacitive measurement electrode to which the electrode switch is connected,
    wherein the capacitive measurement device further comprises
        first electrical connection tracks respectively arranged on the detection surface to be configured to connect to the capacitive measurement means via their respective electrode switch, a plurality of the measurement electrodes being distributed approximately in a first direction of the two intersecting directions; and
        second electrical connection tracks respectively arranged on the detection surface to be configured to connect at a switching signal the respective electrode switches of a plurality of the measurement electrodes distributed approximately in a second direction of the two intersecting directions.

3. The capacitive measurement device according to claim 2, further comprising a guard plane in an appreciably electrically conductive material, at the electrical guard potential, arranged below the measurement electrodes and separated from said electrodes by at least one layer of an appreciably electrically insulating material.

4. The capacitive measurement device according to claim 2, wherein the electrode switches comprise two transistors, a first one of the transistors being configured to connect one of the at least one measurement electrode to the capacitive measurement means, and a second one of the transistors being configured to connect said measurement electrode to the guard potential, the first and second transistors being controlled by a switching signal such that when one of the transistors is on-state, the other of the transistors is off-state.

5. The capacitive measurement device according to claim 1, further comprising a guard plane in an appreciably electrically conductive material, at the electrical guard potential, arranged below the at least one measurement electrode and separated from said electrode by at least one layer of an appreciably electrically insulating material.

6. The capacitive measurement device according to claim 5, wherein the at least one electrode switch is connected electrically to the guard plane by electrical connections passing through the at least one layer of appreciably insulating material.

7. The capacitive measurement device according to claim 6, wherein the at least one electrode switch comprises two transistors, a first one of the transistors being configured to connect one of the at least one measurement electrode to the capacitive measurement means, and a second one of the transistors being configured to connect said measurement electrode to the guard potential, the first and second transistors being controlled by a switching signal such that when one of the transistors is on-state, the other of the transistors is off-state.

8. The capacitive measurement device according to claim 5, wherein the at least one electrode switch comprises two transistors, a first one of the transistors being configured to connect one of the at least one measurement electrode to the capacitive measurement means, and a second one of the transistors being configured to connect said measurement electrode to the guard potential, the first and second transistors being controlled by a switching signal such that when one of the transistors is on-state, the other of the transistors is off-state.

9. The capacitive measurement device according to claim 1, wherein the at least one electrode switch comprises two transistors, a first one of the transistors being configured to connect one of the at least one measurement electrode to the capacitive measurement means, and a second one of the transistors (4) being configured to connect said measurement electrode to the guard potential, the first and second transistors being controlled by a switching signal such that when one of the transistors is on-state, the other of the transistors is off-state.

10. The capacitive measurement device according to claim 9, further comprising transistors produced according to a thin layer deposition technology.

11. The capacitive measurement device according to claim 9, further comprising transistors which are substantially transparent.

12. The capacitive measurement device according to claim 9, further comprising transistors of one of the following types: a thin-field transistor (TFT)-type field-effect transistor, and organic field-effect transistor (OFET)-type transistors based on organic semiconductors.

13. The capacitive measurement device according to claim 1, wherein the capacitive measurement device which is substantially transparent.

14. The capacitive measurement device according to claim 1, wherein at least one element among the at least one measurement electrode, a guard plane, and tracks comprises tin-doped indium oxide (ITO).

15. The capacitive measurement device according to claim 1, further comprising a switch configured to connect the at least one electrode switch either to the capacitive measurement means or to the guard potential.

16. The capacitive measurement device according to claim 1, further comprising the capacitive measurement means including a floating part referenced to a reference electrical potential which is floating with respect to earth potential.

17. The capacitive measurement device according to claim 16, wherein the reference electrical potential is approximately equal to the guard potential.

18. A human-machine interface device, comprising:
a command interface; and
the capacitive measurement device according to claim 1.

19. The human-machine interface device according to claim 18, wherein the command interface is equipped with a display screen, and
the capacitive measurement device is substantially transparent.

20. A device of one of the following types: a smartphone, a tablet, a display screen, a computer, and a control pad for a machine or vehicle, the device comprising:
the human-machine interface device according to claim 18.

* * * * *